United States Patent [19]

Kondou et al.

[11] Patent Number: 4,876,466

[45] Date of Patent: Oct. 24, 1989

[54] PROGRAMMABLE LOGIC ARRAY HAVING A CHANGEABLE LOGIC STRUCTURE

[75] Inventors: Harufusa Kondou; Hiroshi Kuranaga, both of Hyogo, Japan

[73] Assignee: Mitsubishi Denki Kabushiki Kaisha, Tokyo, Japan

[21] Appl. No.: 269,763

[22] Filed: Nov. 10, 1988

[30] Foreign Application Priority Data

Nov. 20, 1987 [JP] Japan .................. 62-294557

[51] Int. Cl.[4] .................. G06F 7/38; H03K 19/094
[52] U.S. Cl. .................. 307/465; 307/451; 307/469; 364/716
[58] Field of Search .............. 307/443, 448, 451, 465, 307/468, 469, 272 R; 365/96; 364/716

[56] References Cited

PUBLICATIONS

Neil H. E. Weste et al., "Principles of CMOS VLSI Design" (Addison-Wesley Publishing 1985) pp. 368–379.

Amar Mukherjee, "Introduction to nMOS and CMOS VLSI Systems Design" pp. 52063.

Primary Examiner—Stanley D. Miller
Assistant Examiner—M. K. Wambach
Attorney, Agent, or Firm—Lowe, Price, LeBlanc, Becker & Shur

[57] ABSTRACT

Programmable Logic Array PLA) cells are arranged at intersections of input lines and output lines of the array. Particular PLA cells to be programmed are arbitrarily selected by word line and bit line decoders. Switches for programming the PLA cells to implement a desired logic function are controlled by data stored in a random access memory whereby programming of the PLA can be changed arbitrarily and during operation of a system including the PLA.

13 Claims, 12 Drawing Sheets

FIG. 7B $O_1 = \overline{Q_3} \cdot Q_2 \cdot Q_1$
$O_2 = \overline{Q_3} \cdot \overline{Q_2} \cdot \overline{Q_1}$
$O_3 = \overline{Q_3} \cdot Q_2 \cdot \overline{Q_1}$

FIG. 7C $O_1 = Q_3 \cdot Q_2 \cdot Q_1$
$O_2 = \overline{Q_3} \cdot \overline{Q_2} \cdot \overline{Q_1} + \overline{Q_3} \cdot \overline{Q_2} \cdot Q_1$
$O_3 = Q_3 \cdot \overline{Q_2} \cdot \overline{Q_1} + Q_3 \cdot \overline{Q_2} \cdot Q_1$

FIG.8C
WHEN R=1, R'=0

FIG.8D
WHEN R=0, R'=1

PROGRAMMABLE LOGIC ARRAY HAVING A CHANGEABLE LOGIC STRUCTURE

BACKGROUND OF THE INVENTION

1. Field of the Invention

The present invention relates generally to a programmable logic array (hereinafter referred to as PLA) and, more specifically, it relates to a PLA in which the logic associated therewith can be arbitrarily changed.

2. Description of the Prior Art

When complicated combination logics are constituted by AND and OR gates, they require a large number of TTLs. Since a combinational logic which is relatively simple can be realized by one PLA, the application of PLA enables reduction of the number of IC packages. In addition, since the logical expressions can be directly realized, the time required for designing can be reduced. Therefore, the application of PLA is quite advantageous.

The PLA is used not only as a single IC but also in LSIs such as microprocessors. In a control portion of the microprocessor, for example, a combinational logic having a plurality of inputs and a plurality of outputs must be provided for decoding microcodes into control signals in the processors. When the logic is realized by AND/OR gates, the layout becomes irregular, and the logic diagram becomes complicated. However, when PLAs are employed, the combinational logic can be realized in a regular layout, thereby facilitating debugging, and so on.

PLAs provide a flexible and efficient way of synthesizing arbitrary combinational functions in a regular structure. The PLA circuit is based on a representation of Boolean functions as a set of sum-of-products terms. A set of such functions can be mapped into a two-stage NOR networks as shown in FIG. 1A.

Figure 1A:
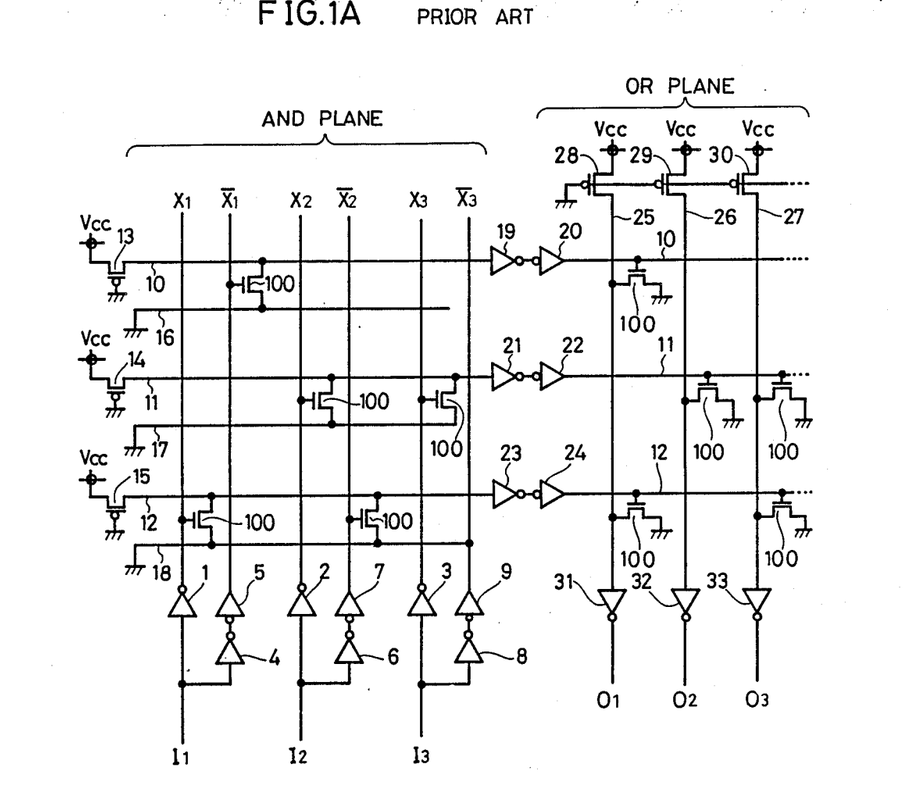
FIG. 1A shows one example of a conventional PLA.

FIG. 1A is a schematic diagram showing one example of a conventional PLA disclosed in, for example, Neil H. E. Weste, Kamran Eshraghian "PRINCIPLES OF CMOS VLSI DESIGN" (Addison-Wesley Publishing 1985) pp. 368~379, or *Introduction to nMOS and CMOS VLSI Systems Design* by Amar Mukherjee pp. 52~63. The PLA shown in this figure is so-called NOR-NOR type PLA and has three inputs (I1 to I3) and three outputs (O1 to O3) as an example. The numbers of the inputs and outputs can be arbitrarily increased by repeating the same circuit structure. Referring to the figure, the PLA comprises an AND plane for programming the AND logic and an OR plane for programming the OR logic. Input signals I1, I2 and I3 are applied to the input lines X1, X2 and X3 through inverters 1, 2 and 3. In addition, the input signal I1 is applied to an inversion input line $\overline{X1}$ through the inverters 4 and 5, the input signal I2 is applied to the inversion input line $\overline{X2}$ through inverters 6 and 7, and the input signal I3 is applied to the inversion input line $\overline{X3}$ through inverters 8 and 9. Therefore, each of the input lines X1 to X3 and the inversion input lines $\overline{X1}$ to $\overline{X3}$ is supplied with each of the input signals I1 to I3 and the inversions thereof. Three product term lines 10 to 12 are provided orthogonal to these input lines X1 to X3 and the inversion input lines $\overline{X1}$ to $\overline{X3}$. These product term lines 10 to 12 are to output desired logical product of the input signals I1 to I3. Each of the P channel MOS transistors 13 to 15 is connected between one end of each of the product term lines 10 to 12 and the power supply $V_{cc}$ as a load. Each of the transistors 13 to 15 has its gate grounded so that it is always in the on-state, the on-resistance serving as a load. Ground lines 16, 17 and 18 are provided so as to be paired with the product term lines 10, 11 and 12, respectively. The product term lines 10, 11 and 12 extend to the OR plane respectively through the inverters 19 and 20, inverters 21 and 22 and inverters 23 and 24. These inverters 19 and 20, 21 and 22, and 23 and 24 are provided as buffers, respectively. On the OR plane, three output lines 25, 26 and 27 are provided orthogonal to the product term lines 10, 11 and 12. One end of each of these output lines 25, 26 and 27 is connected to the power supply $V_{cc}$ through P channel MOS transistors 28, 29 and 30, respectively. These transistors 28, 29 and 30 have their gates grounded as in the case of the aforementioned transistors 13 to 15 serving as loads. The other end of each of the output lines 25, 26 and 27 is connected to each of the inverters 31, 32 and 33, respectively. Outputs O1, O2 and O3 are provided from these inverters 31, 32 and 33. In the above described structure, programming is carried out where N channel MOS transistors 100 are arranged in FIG. 1A. The following logic will be provided by the structure of FIG. 1A:

$$O1 = I1 \cdot \overline{I2} + \overline{I1}$$

$$O2 = I2 \cdot I3$$

$$O3 = I2 \cdot \overline{I2} + I2 \cdot I3$$

Figure 1B:
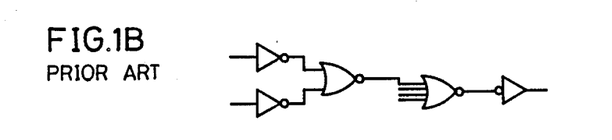
FIGS. 1B and 1C show the logic structure of the PLA shown in FIG. 1A.
Figure 1C:
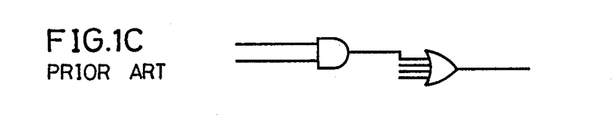

The NOR-NOR type PLA of FIG. 1A has the logic structure of FIG. 1B, which is apparently equivalent with the AND-OR structure shown in FIG. 1C.

Figure 2A:
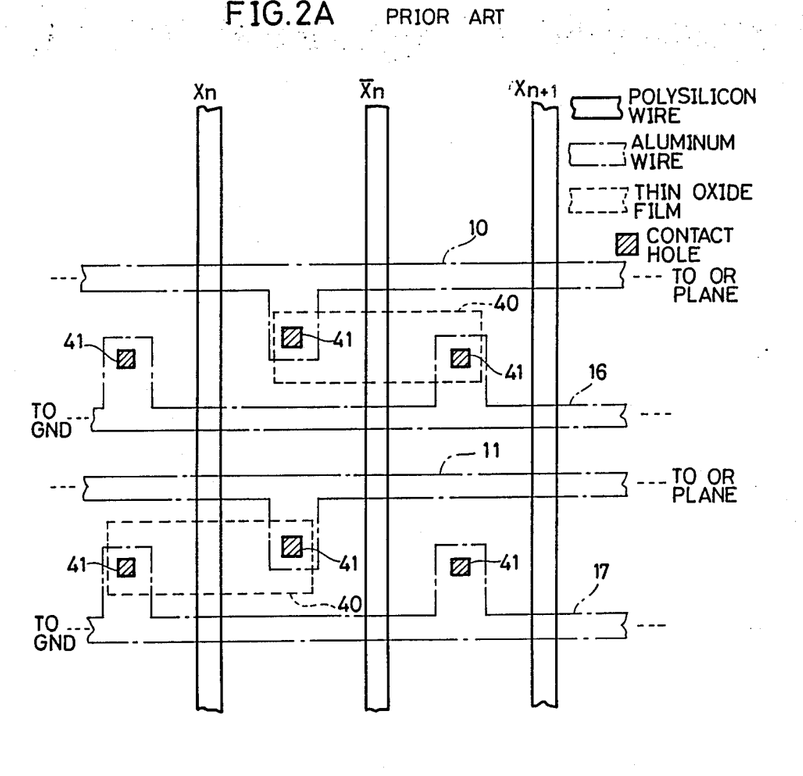
FIG. 2A is a mask pattern plan view for describing one example of the program method of the PLA shown in FIG. 1A.

The programming in the PLA of FIG. 1A is effected by providing or not providing the transistor 100, and one example of the actual application is shown in FIG. 2A.

Figure 2B:
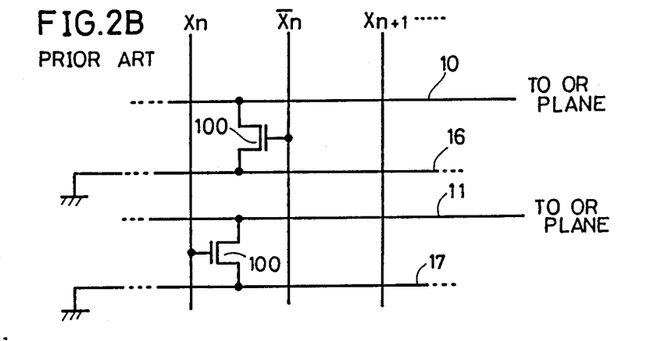
FIG. 2B shows an equivalent circuit of the PLA programmed in accordance with FIG. 2A.

FIG. 2A shows one example of a mask layout of a PLA cell in which programming is carried out by forming or not forming thin oxide film layer 40. Referring to FIG. 2A, a thin oxide film layer 40 is formed to cover two contact holes 41 (one contact hole is connected to the product term line and the other contact hole is connected to the ground line), which are adjacent to each other with an input line X or an inversion input line $\overline{X}$ serving as a gate wiring sandwiched therebetween. Portions other than the thin oxide film layers 40 are covered with a thick oxide film. When ion implantation is carried out in this state, ions are implanted only on the surface of the semiconductor substrate below the thin oxide film layers 40, thereby forming drain regions and source regions. Consequently, transistors 100 are formed on the positions shown in FIG. 2B.

Other than the above described method, programming may be carried out utilizing aluminum wirings or utilizing the presence/absence of a contact hole. However, either of these is so-called mask program, and therefore, once the device is formed, the programmed logic cannot be changed afterwards.

Meanwhile, there is FPLA (Field Programmable Logic Array) which can be programmed after the formation of the device, in which programming is effected by melting and cutting fuse or by utilizing nonvolatile memory. However, when programming is carried out by melting and cutting fuse, once programming is effected, thereafter it cannot be changed arbitrarily. Although program can be changed when the nonvolatile memory is employed, high voltage or a special rewriting circuit is necessary for rewriting, so that the change of program cannot be carried out during the system operation. In addition, it takes much cost due to the special process.

Since a conventional PLA is structured as described above, arbitrary change of the program cannot be carried out once it is programmed and, in order to change the program, it must be thoroughly made anew from the mask. Although program can be changed in a FPLA utilizing the nonvolatile memory, the change of the program cannot be carried out during the operation of the system and, in addition, it takes much cost due to the special process employed.

SUMMARY OF THE INVENTION

Accordingly, one object of the invention is to provide a PLA in which the program thereof can be arbitrary changed after the PLA is formed.

Another object is to provide a PLA in which the program thereof can be changed arbitrarily during the operation of the PLA.

A further object is to provide a PLA having a program that can be changed without melting or cutting fuses, applying a high voltage thereto or remasking.

In the PLA in accordance with the present invention, a PLA cell is provided at each intersection of a plurality of input signal lines and a plurality of output signal lines, and in the PLA cell, when selected by the addressing means, external data is stored in rewritable memory means, the output of the memory means controls opening/closing of switching means and this opening/closing of the switching means controls whether programming should be effected or not on a program device.

According to the present invention, a PLA cell provided at each of the intersections of the input signal lines and the output signal lines can be arbitrarily programmed based on externally applied data by the addressing means, so that logics can be arbitrarily changed. Accordingly, in the present invention, a PLA is provided in which the change of the program can be arbitrarily carried out after the formation of the device and, in addition, the change of the program can be carried out during the operation of the system without using any special rewriting device.

These objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 3A:
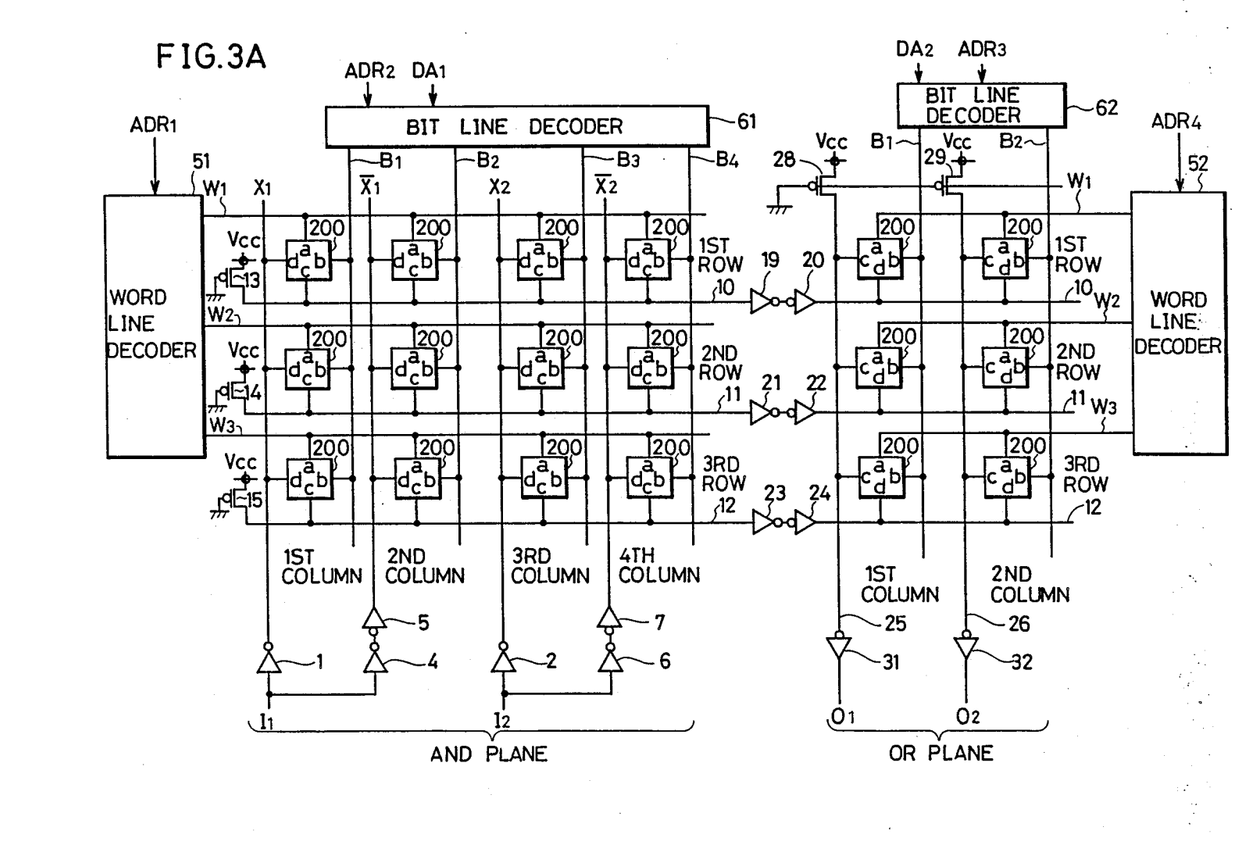
FIG. 3A shows one embodiment of a PLA of the present invention.

FIG. 3A is a block diagram showing the structure of a PLA in accordance with one embodiment of the present invention. In the figure, the same portions as in the PLA shown in FIG. 1A are denoted by the same reference numerals and the descriptions thereof will be omitted.

Referring to the figure, PLA cells 200 which characterize the present invention are arranged in matrix both in the AND plane and OR plane of the PLA. Each PLA cell 200 has terminals a, b, c and d. In the AND plane, provided are a word line decoder 51 for selecting one of the word lines W1, W2 and W3 in response to an externally applied (for example from a microcomputer) address signal ADR1 and a bit line decoder 61 for selecting one of the bit lines B1, B2, B3 and B4 in response to an externally applied address signal ADR2 and for supplying the selected bit line with external data DA1. Said word lines W1, W2 and W3 are connected to each of the terminals a of the PLA cells 200 of the first, second and third rows. Said bit lines B1, B2, B3 and B4 are respectively connected to each of the terminals b of the PLA cells of the first, second, third and fourth column. The product term lines 10, 11 and 12 are connected to each of the terminals c of PLA cells 200 of the first, second and third rows. In addition, the input line X1 is connected to each terminal d of the PLA cells of the first row, the inverted input line $\overline{X1}$ is connected to each terminal d of the PLA cells 200 of the second row, the input line X2 is connected to each terminal d of the PLA cells 200 of the third row and the inverted input line $\overline{X2}$ is connected to each terminal d of the PLA cells 200 of the fourth row.

Meanwhile, in the OR plane, provided are a word line decoder 52 for selecting one of the word lines W1, W2 and W3 in response to an external address signal ADR4 and a bit line decoder 62 for selecting one of the bit lines B1 and B2 in response to an external address signal ADR3 and for supplying the selected bit line with external data DA2. In the same manner as in the AND plane, word lines W1, W2 and W3 are respectively connected to the terminals a of the PLA cells 200 of the first, second and third row and product term lines 10, 11 and 12 are respectively connected to the terminals d. Bit lines B1 and B2 are respectively connected to the terminals b and output lines 25 and 26 are respectively connected to the terminals c of the PLA cells of the first and second column.

Figure 4A:
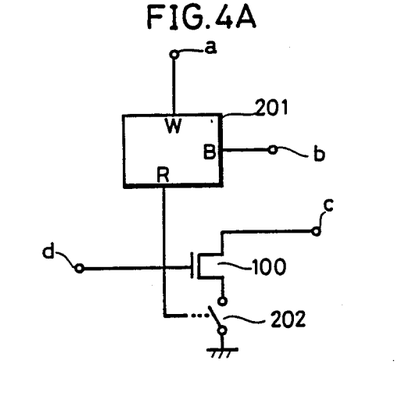
FIGS. 4A to 4C show examples of each PLA cell structure in the embodiment of FIG. 3A.
Figure 4B:
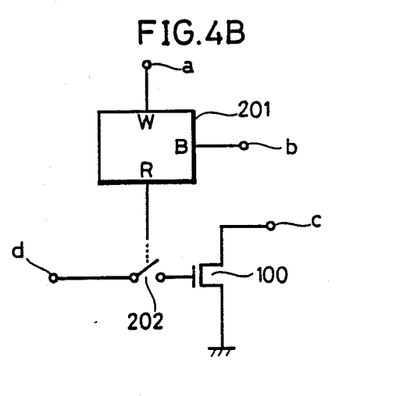
Figure 4C:
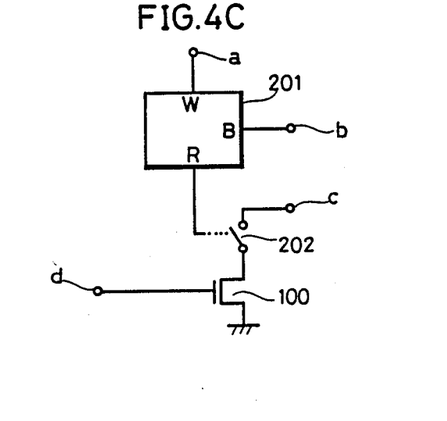
Figure 5A:
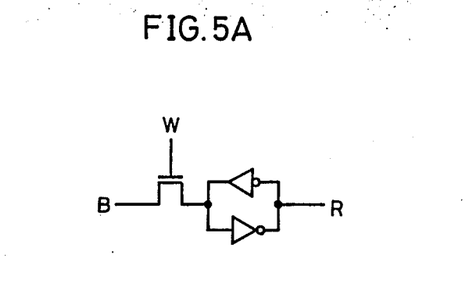
FIGS. 5A and 5B show examples of circuit structures of RAM cells 201 shown in FIGS. 4A to 4C.
Figure 5B:
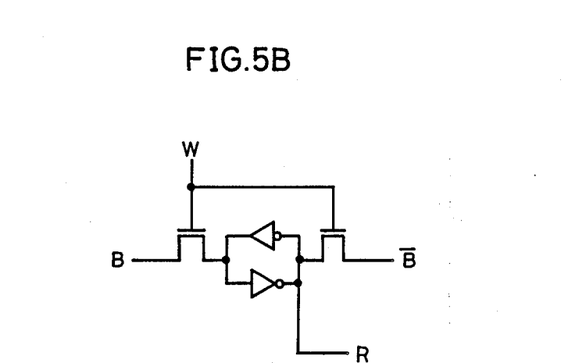

FIGS. 4A, 4B and 4C show three examples of the actual structure of the PLA cell 200 shown in FIG. 3A. Each structure comprises a RAM cell 201, N channel MOS transistor 100 and a switching device 202. The difference between each of the structures is where the switching device 202 is arranged with respect to the transistor 100. The RAM cell 201 stores the data supplied from the selected bit lines through the terminal b when selected by the word line decoder 51 or 52 and outputs an inverted output from a terminal R. One example of the circuit structure of such RAM cell 201 is shown in FIG. 5A. Meanwhile, FIG. 5B is an example of the structure of RAM cell having two bit lines B and $\overline{B}$. Either RAM cell of FIG. 5A or FIG. 5B is the same as a common RAM cell except that the inverted output of the stored data is taken out from the terminal R.

Figure 6:
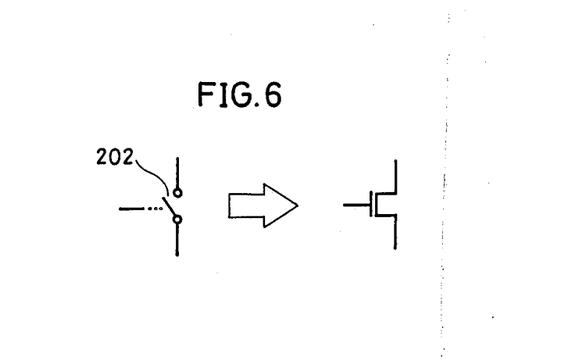
FIG. 6 shows one example of switching devices 202 shown in FIGS. 4A to 4C.

The output taken out from the terminal R of the above described RAM cell 201 is applied to the switching device 202 as an opening/closing control signal in any of FIGS. 4A to 4C. For the switching device 202, an N channel MOS transistor is employed, for example, as shown in FIG. 6. In FIG. 4A the switching device 202 is interposed between the source of the transistor 100 and the ground, in FIG. 4B the switching device 202 is interposed between the gate of the transistor 100 and the terminal d (connected to the input lines), and in FIG. 2C the switching device 202 is interposed between the drain of the transistor 100 and the terminal c (connected to the product term line). The transistor 100 effects the same function as the transistor 100 for programming in a conventional PLA shown in FIG. 1A.

In the above described structure, in the PLA cell shown in FIGS. 4A to 4C, when the switching device 202 is turned on, the drain of the transistor 100 is connected to the product term line through the terminal c, the source is connected to the ground and the gate is connected to the input line through the terminal d. Therefore, the transistor 100 effects the same function as the transistor 100 shown in FIG. 1A. On the other hand, if the switching device 202 is off, then source, drain or gate of the transistor 100 is cut off and, therefore, as for the function, it is the same as in the case where there is no transistor 100. Which of the source, drain and gate of the transistor 100 should be cut off is dependent on which structure of FIGS. 4A, 4B and 4C is employed. The switching device 202 is controlled by the data (taken out from the terminal R) stored in the RAM cell 201. If the N channel MOS transistor shown in FIG. 6 is employed as the switching device 202, the switching device 202 is turned off when the output of the terminal R is 0 and the switching device 202 is turned on when the output of the terminal R is 1. Since the output of terminal R is the inversion of the data written by a bit line, the PLA cell in which 1 is written is not programmed and the PLA cell in which 0 is written is programmed.

The writing into the RAM cell 201 is similar to that into a common RAM. As for the RAM cell 201 for the AND plane, data DA1 is written in the RAM cell 201 specified by the address signals ADR1 and ADR2, and as for the RAM cell 201 for the OR plane, data DA2 is written in the RAM cell 201 specified by the address signals ADR3 and ADR4. The control of the writing in the RAM cell has been well known, so that the detailed description thereof will be omitted.

Although a PLA has two input, two output and three product term line, it is not limited to this and more inputs, outputs and product term lines can be provided by expanding the array structure. Although the PLA shown in FIG. 3A is a static type employing P channel transistors 13 to 15 which are always turned on as the product term line loads, the PLA structure may be the dynamic type and the same effect can be obtained so long as the same PLA cell is used. In addition, the PLA need not necessarily be provided with both of the AND plane and OR plane, and it may have only one of these planes dependent on the use.

Figure 3B:
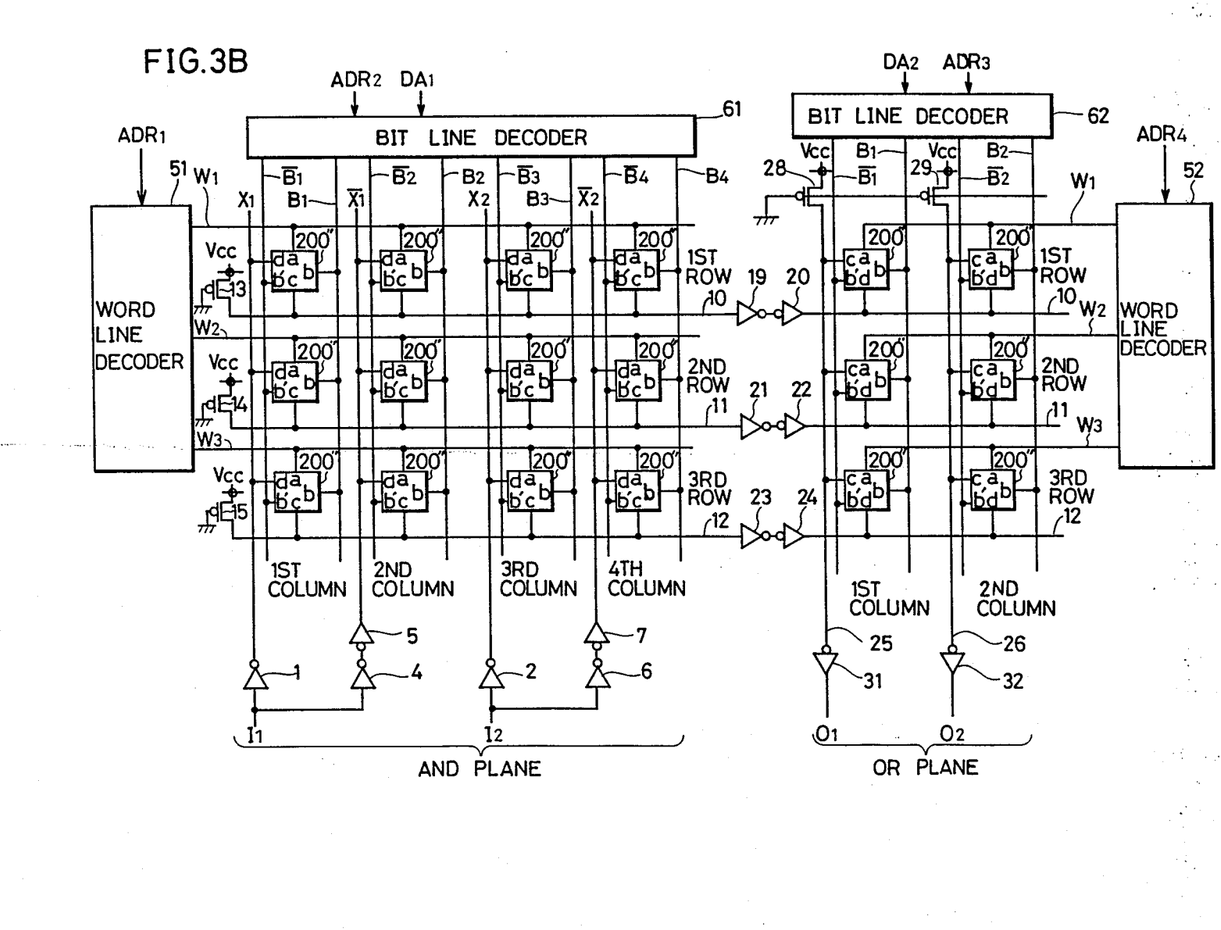
FIG. 3B shows a PLA in accordance with another embodiment of the present invention.
Figure 3C:
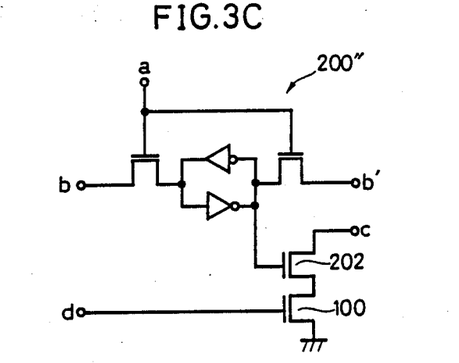
FIG. 3C is a schematic diagram showing an example of a structure of a PLA cell 200" employed in the embodiment of FIG. 3B.

FIG. 3B shows a case in which the PLA comprises bit lines $\overline{B1}$ to $\overline{B4}$ which constitute pairs with the bit lines B1 to B4, respectively. The structure shown in FIG. 3C is employed as each PLA cell 200'', for example.

Figure 7A:
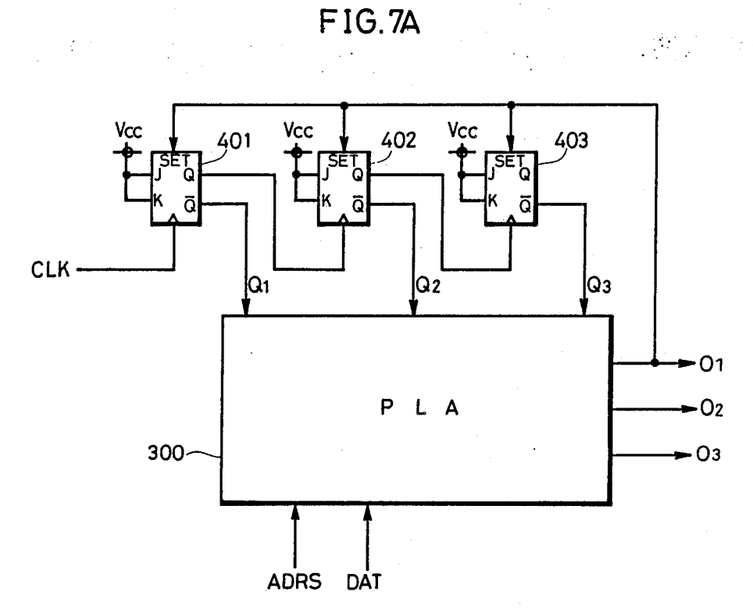
FIG. 7A shows one example of a signal generation circuit formed with the PLA shown in FIG. 3.
Figure 7B:
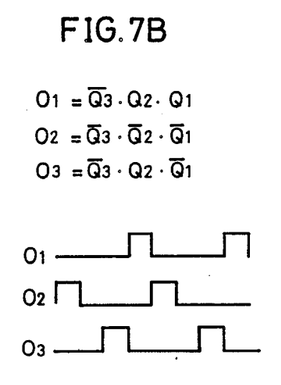
FIGS. 7B and 7C show program logics and waveforms of output signals of the PLA 300 in the signal generation circuit of FIG. 7A.
Figure 7C:
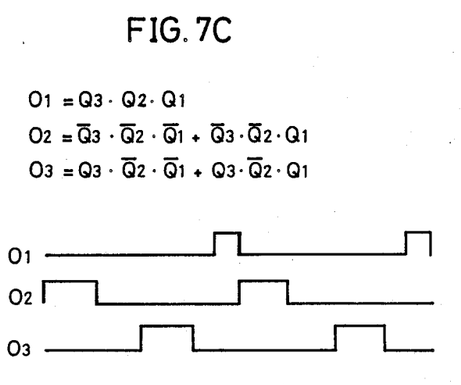

FIG. 7A shows one example of a signal generation circuit structured with the PLA shown in FIG. 3A. In the figure, the PLA 300 is structured as a three input, three output type PLA. Address signals ADRS and data DAT are externally applied to the PLA 300. The address signal ADRS is a collection of the address signals (address signals ADR1 and ADR2 of FIG. 3A) on the AND plane and the address signals (address signals ADR3 and ADR4 of FIG. 3A) on the OR plane, and the data DAT is the collection of the data (data DA1 of FIG. 3A) applied to the AND plane and the data (data DA2 of FIG. 3A) applied to the OR plane. Each of the JK flip flops 401 to 403 has J=K=1, so that the output Q is inverted every time when there is a clock input. Therefore, each of the JK flip flops 401 to 403 carries out the divide-by-2 operation and, therefore, three JK flip flops 401 to 403 can effect the divide-by-8 operation. The outputs Q1 to Q3 of respective JK flip flops 401 to 403 successively change from the binary number 000 to 111 at every clock input with Q1 being the least significant bit, when no set signal enters the terminal SET. By using these outputs Q1 to Q3 as inputs to the PLA 300 and by programming the logics of the three outputs O1 to O3 of the PLA 300 such as shown in FIGS. 7B and 7C, two sets of two-phase non-overlapping clock signals O2 and O3, each set having different cycle from each other can be generated. Namely, by using the PLA 300 in accordance with the embodiment of FIG. 3A, clock signal sets each of which having cycles different from each other can be obtained in one circuit by appropriately rewriting the contents of the RAM cell 201 in the PLA cell. Although only two are shown in the examples of FIGS. 7B and 7C, any clock signals within the range of 8 clocks can be generated by programming different values in the PLA 300. Although three Jk flip flops 401 to 403 constitute so-called counters, this circuit may have other structure and the bit number is not limited to three.

Figure 8A:
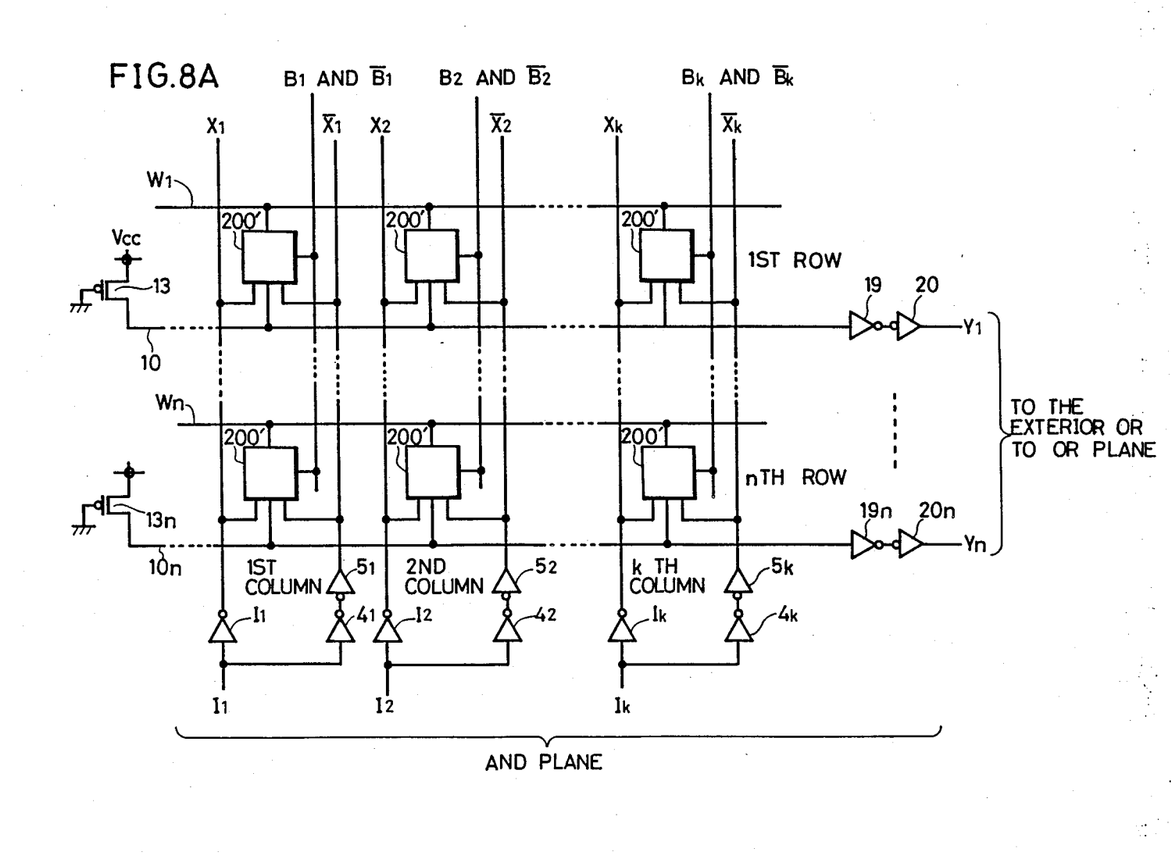
FIG. 8A shows a PLA in accordance with a further embodiment of the present invention.
Figure 8B:
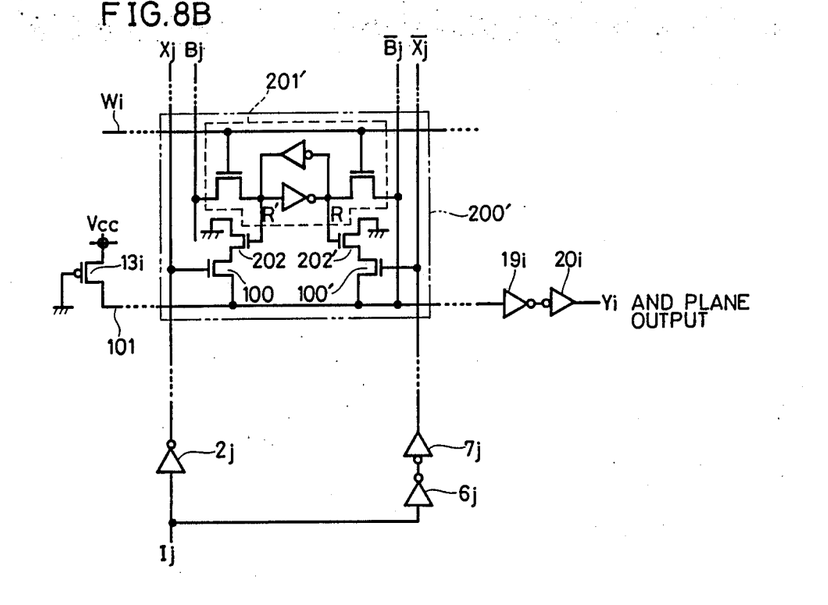
FIG. 8B shows one embodiment of the circuit structure of the PLA cell 200' used in the embodiment of FIG. 8A.
Figure 8C:
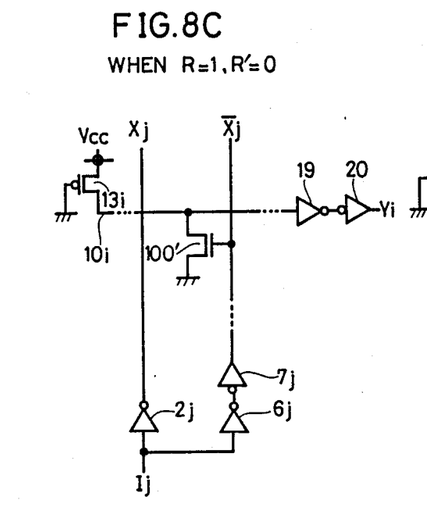
FIGS. 8C and 8D are diagrams for describing the operation of the PLA cell 200' shown in FIG. 8B.
Figure 8D:
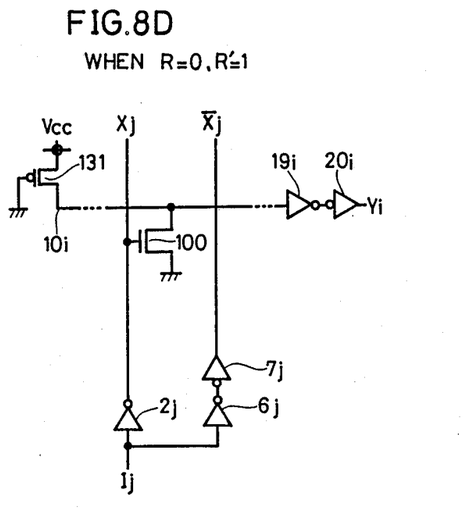

FIG. 8A shows a PLA in accordance with another embodiment of the present invention. In the figure, each of the PLA cells 200' in this embodiment is the collection of two PLA cells 200 which are arranged next to each other in the same row in FIG. 3A and respectively connected to the pair of the input line X and the inverted input line $\overline{X}$. The peripheral circuit may be connected in the similar manner as FIG. 3A. One example of the circuit structure of the PLA cell 200' is shown in FIG. 8B. Although the structure of one PLA cell is shown as a representative, the structure of other PLA cells is the same as that shown in FIG. 8B. In FIG. 8B, the PLA cell 200' comprises a RAM cell 201', the structure shown in FIG. 5B is employed as the RAM cell 201'. If the PLA has the single bit structure as in FIG. 3A, the RAM cell shown in FIG. 5A may be used. The structure of FIG. 6 is used as the switching device 202 and 202'. The PLA cell 200' shown in FIG. 8B is structured such that the switching devices 202 and 202' turns on and off complementarily dependent on the data stored in the aforementioned RAM cell 201' so that either of the transistors 100 and 100' is activated. Therefore, the PLA cell 200' operates to be programmed in response to the input signal Ij or the inversion thereof $\overline{Ij}$. The equivalent circuit for R=1 is shown in FIG. 8C and the equivalent circuit for R=0 is shown in FIG. 8D.

In the structure shown in FIGS. 8A and 8B, an arbitrary output Yi (i=1~n) on the AND plane becomes 1 only when the stored data of the RAM cell 201' in each of the PLA cell 200' of the ith row and the input signals I1, I2, ..., Ik are all coincident with each other. This will be described in the following manner. In FIG. 8B, if the stored data in the RAM cell 201' is 1, namely, R=0 and R'=1, it is the equivalent circuit of FIG. 8D, but if the input signal Ij (j=1~k) is 1 (coincidence), the transistor 100 is off and, therefore, the output Yi is 1. However, if the input signal Ij is 0, the transistor 100 turns on and the output Yi becomes 0. On the contrary, if the stored data in the RAM cell 201' is 0, then R=1 and R'=0 and it is the equivalent circuit of FIG. 8C. In this case, if the input signal Ij equals 0 (coincident), the transistor 100 is off and therefore the output Yi is 1. On the other hand, if the input signal Ij is 1, the transistor 100 turns on and the output Yi becomes 0. Since the PLA cells 200' on the ith row are connected to the same product term line 10, if any of the PLA cell has data which is not coincident with other data, then the output Yi becomes 0. In other words, the output Yi becomes 1 only when the data is coincident with each other for all the PLA cells 200' in the ith row.

Therefore, by the structure of FIGS. 8A and 8B, the stored data in the RAM cell 201' can be compared with the input signals I1 to Ik, whereby there is provided a data coincidence detection circuit. This can be applied to the address coincidence detection portion such as a cash memory in a microcomputer. When it is desired to know whether the input signal is coincident with any of the RAM cell 201' in the same row, OR plane may be added.

The structure of FIG. 3A may be employed in part of the AND plane and the OR plane and the conventional structure shown in FIG. 1A may be employed in the remaining portion. The combination may be determined by the designer and user of the PLA to meet the necessity.

As for the RAM cell portion, it must have the writing circuit only, and the reading circuit such as sense amplifier is not necessary. However, by providing the reading circuit, the applicable field will be widened.

In addition, the MOS transistors used for each PLA cell 200, 200', product term line load and output line load are not limited to the channel type shown and the opposite channel type may be employed.

Figure 9A:
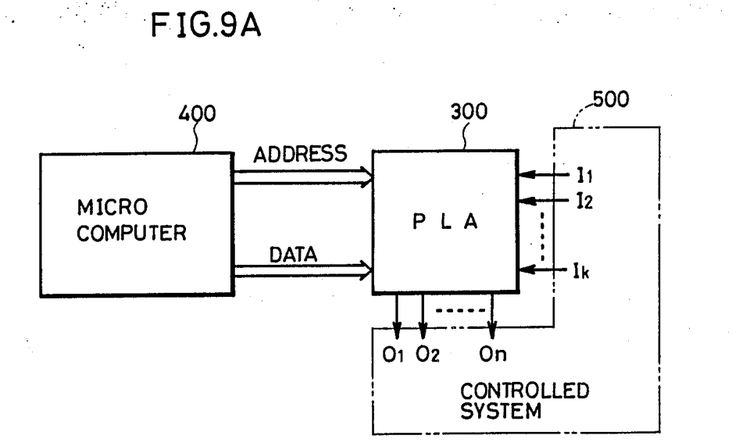
FIG. 9A shows one example of a typical control system structured by using the PLA in accordance with the embodiments of the present invention.
Figure 9B:
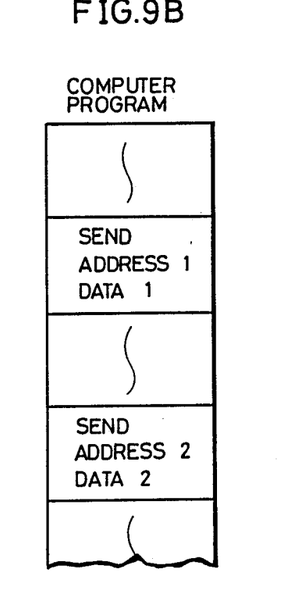
FIG. 9B shows one example of a program list of a microcomputer 400 in FIG. 9A.

One example of a typical control system structured with the above described PLA is shown in FIG. 9A. In the figure, the microcomputer 400 applies address and data to the PLA 300 of the present embodiment to program the desired PLA cell. The PLA 300 processes the input signals I1 to Ik provided from the controlled system 500 according to the programmed prescribed logic and draws out outputs O1 to On to the controlled system 500. As shown in FIG. 9B, by the program of the microcomputer 400, the program state of the PLA 300 can be arbitrarily changed during the operation of the system.

Figure 10A:
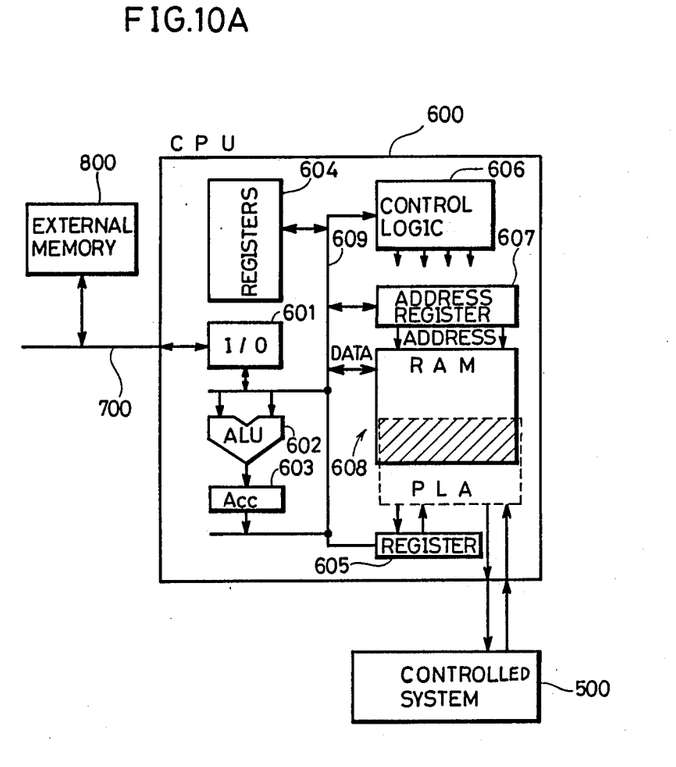
FIG. 10A is a schematic diagram showing a structure of a control system in which a PLA in accordance with an embodiment of the present invention is employed in a LSI such as a microprocessor.

FIG. 10A is a block diagram showing a structure of a control system in which the PLA in accordance with the present invention is applied in a LSI such as microprocessor. Referring to the figure, a 1 chip microprocessor 600 comprises an I/O interface 601, an ALU (Arithmetic Logic Unit) 602, an ACC (Accumulator) 603, registers 604 and 605, a control logic 606, an address register 607 and a RAM/PLA 608, each of these circuits connected to an internal data bus 609. The 1 chip microprocessor 600 is connected to an external memory 800 through an external data bus 700, with necessary data for control taken from the external memory. The 1 chip microprocessor 600 is connected to an external system 500 to control the system 500.

Figure 10B:
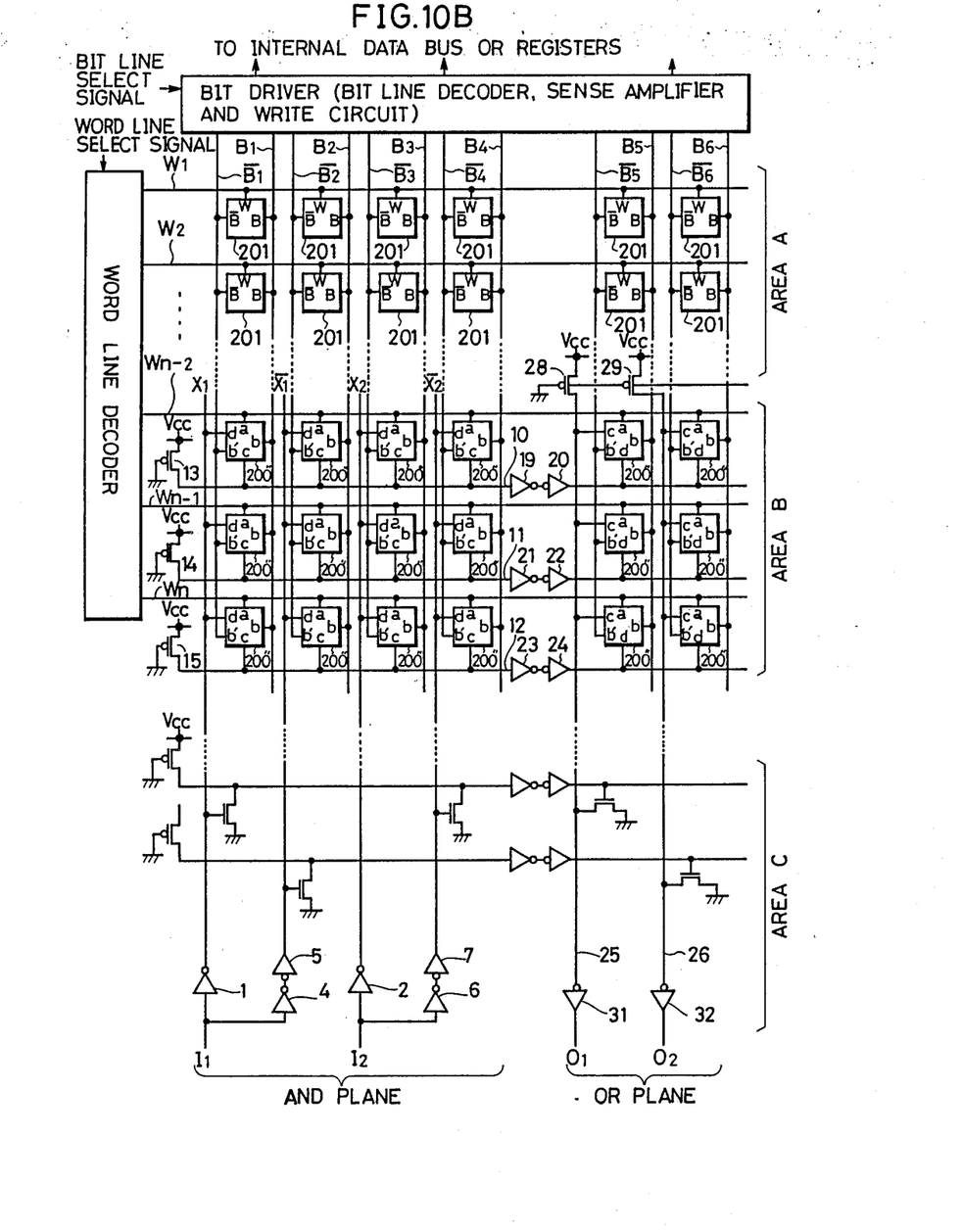
FIG. 10B is a schematic diagram showing an example of a structure of the RAM/PLA 608 in the system of FIG. 10A.

The above described RAM/PLA 608 comprises an area A which is used as a RAM, such as shown in FIG. 10B, an area B which is used as the PLA in accordance with the embodiment of the present invention such as shown in FIG. 3A, and an area C which is used as the conventional PLA such as shown in FIG. 1A, and therefore, the RAM/PLA 608 has the functions of the RAM and of the PLA. A RAM 201 such as shown in FIG. 5B is used for the area A. A PLA cell 202' such as shown in FIG. 3C is used for the area B.

In the system of FIG. 10A, signals corresponding to the address signals ADR1, ADR2, ADR3 and ADR4 and the data DA1, DA2 in FIG. 3B are written in the same manner as a common microprocessor writing in an internal RAM. More specifically, data from the internal data bus 609 are read from and written in the address stored in the address register 607. When writing is carried out in an address corresponding to the area B of FIG. 9B, the logic of the PLA in the area B is changed. Portions of the input and output lines of the PLA exchanges data with the register 605 used exclusively for that purpose, and other portions control the system 500 to be controlled which is out of the chip. By providing such structure, the logic of the PLA can be dynamically changed more effectively compared with the case in which the PLA of the present invention is employed outside of the chip. In addition, the storing element (RAM cells 201 of the FIGS. 4A to 4C) determining the logic of the PLA can be shared with the RAM of the processor to reduce the hardware and to enlarge that field of application.

The PLA exchanges data with the inner portions of the chip through the register 605 in the present embodiment. If it is adapted to exchange data with other blocks in the chip so as to have the same function as the control lines from the control logic 606, a processor having variable structure may possibly be provided, further enlarging the field of application.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A programmable logic array (PLA) comprising:
   a plurality of input signal lines each including a first input line for directly transmitting an input signal and a second input line for transmitting an inverted input signal;
   a plurality of output signal lines crossing said input signal lines;
   a plurality of programmable logic array cells at intersections of said plurality of input signal lines and said plurality of output signal lines, said programmable logic array cells forming an AND plane, each of said cells being programmable and commonly provided to a pair of said first input signal lines and said second input signal lines; and
   addressing means for selecting particular ones of said programmable logic array cells, wherein each said programmable logic array cell comprises
   (a) a random access memory for storing external data when selected by said addressing means, said memory being rewritable during operation of said PLA while carrying out a predetermined logic function for changing said function,
   (b) switching means which are opened or closed, selectively, by outputs of said memory means, and
   (c) PLA programming devices controlled by said switching means and connected to corresponding ones of said input signal lines and said output signal lines;
   wherein said PLA is alterably programmable by data stored in said memory means.

2. A PLA claimed in claim 1, wherein said PLA programming device is a MOS transistor, wherein said MOS transistor is arranged to have its drain connected to said output signal line, its source grounded and its gate connected to said input signal line when said corresponding switching means is closed.

3. A PLA claimed in claim 2, wherein said switching means is interposed between the drain of said MOS transistor and said output signal line.

4. A PLA claimed in claim 2, wherein said switching means is interposed between the source of said MOS transistor and the ground.

5. A PLA claimed in claim 2, wherein said switching means is interposed between the gate of said transistor and said input signal line.

6. A PLA claimed in claim 1, wherein said switching means is a MOS transistor.

7. A PLA claimed in claim 1, wherein said programmable logic array cell is respectively provided on said first input signal line and on said second input signal line.

8. A PLA claimed in claim 1, wherein said output signal line is a product term line outputting a logical product of each row of said programmable logic array cell.

9. A PLA claimed in claim 8, wherein said programmable logic array cell is developed to form an OR plane having said product term line as an input signal line.

10. A PLA claimed in claim 1, wherein said programmable logic array cell form an OR plane.

11. A PLA claimed in claim 1, wherein said addressing means comprises
   a first decoder for selecting a row of said programmable logic array cell, and
   a second decoder for selecting a column of said programmable logic array cell.

12. A programmable logic array (PLA), comprising:
   a plurality of input signal lines;
   a plurality of output signal lines crossing said input signal lines;
   a plurality of programmable logic array cells at intersections of said plurality of input signal lines and said plurality of output signal lines, each of which cell can be programmed; and
   addressing means for selecting particular ones of said programmable logic array cells, wherein each said programmable logic array cell comprises
   (a) a random access memory for storing external data when selectee by said addressing means, said memory being rewritable during operation of said PLA while carrying out a predetermined logic function for changing said function,
   (b) switching means which are opened or closed, selectively, by outputs of said memory means, and
   (c) PLA programming devices controlled by said switching means and connected to corresponding ones of said input signal lines and said output signal lines;
   wherein said PLA is alterably programmable by data stored in said memory means, and a microcomputer for reprogramming the PLA while the PLA is carrying out a predetermined logic function is provided;
   said microcomputer including an internal memory wherein said PLA is structured utilizing a portion of said internal memory.

13. A programmable logic array (PLA), comprising:
   a plurality of input signal lines;
   a plurality of output signal lines crossing said input signal lines;
   a plurality of programmable logic array cells at intersections of said plurality of input signal lines and said plurality of output signal lines, each of which cell can be programmed; and
   addressing means for selecting particular ones of said programmable logic array cells, wherein each said programmable logic array cell comprises
   (a) a random access memory for storing external data when selectee by said addressing means, said memory being rewritable during operation of said PLA while carrying out a predetermined logic function for changing said function,
   (b) switching means which are opened or closed, selectively, by outputs of said memory means, and
   (c) PLA programming devices controlled by said switching means and connected to corresponding ones of said input signal lines and said output signal lines;
   wherein said PLA is alterably programmable by data stored in said memory means, and a microcomputer for reprogramming the PLA while the PLA is carrying out a predetermined logic function is provided, said microcomputer including an internal memory wherein said PLA is structured utilizing a portion of said internal memory;
   a method of operating said PLA, including the steps of programming said random access memory for defining a predetermined logic function, operating said PLA for carrying out the predetermined function programmed in said random access memory, and, during said step of operating PLA, reprogramming said random access memory to define a different predetermined logic function.

* * * * *